United States Patent
Utano et al.

(10) Patent No.: US 10,573,525 B2
(45) Date of Patent: Feb. 25, 2020

(54) PLASMA APPARATUS AND METHOD FOR PRODUCING THE SAME

(71) Applicant: Shinkawa Ltd., Tokyo (JP)

(72) Inventors: Tetsuya Utano, Tokyo (JP); Yuichiro Noguchi, Tokyo (JP)

(73) Assignee: SHINKAWA LTD., Tokyo (JP)

( * ) Notice: Subject to any disclaimer, the term of this patent is extended or adjusted under 35 U.S.C. 154(b) by 516 days.

(21) Appl. No.: 13/889,478

(22) Filed: May 8, 2013

(65) Prior Publication Data

US 2013/0240146 A1    Sep. 19, 2013

Related U.S. Application Data

(63) Continuation of application No. PCT/JP2011/075482, filed on Nov. 4, 2011.

(30) Foreign Application Priority Data

Nov. 9, 2010   (JP) ................. 2010-251099

(51) Int. Cl.
  *H01L 21/00*   (2006.01)
  *H01L 21/3065*   (2006.01)

(52) U.S. Cl.
  CPC ..... *H01L 21/3065* (2013.01); *Y10T 29/49002* (2015.01)

(58) Field of Classification Search
  CPC ... H05H 2001/2431; H05H 2001/2443; H05H 1/2406; H05H 2001/2412; H01J 37/32348; H01J 37/3211
  USPC ....... 118/723 E; 156/345.43, 345.44, 345.45, 156/345.46, 345.47
  See application file for complete search history.

(56) References Cited

U.S. PATENT DOCUMENTS

| | | | | |
|---|---|---|---|---|
| 5,833,752 A | * | 11/1998 | Martin | 118/723 VE |
| 6,191,532 B1 | * | 2/2001 | Liehr | 315/111.21 |
| 6,465,964 B1 | * | 10/2002 | Taguchi et al. | 315/111.21 |
| 6,800,336 B1 | * | 10/2004 | Fornsel et al. | 427/562 |
| 7,582,184 B2 | * | 9/2009 | Tomita | H01J 37/32009 118/723 E |
| 7,793,612 B2 | * | 9/2010 | Guskov et al. | 118/723 R |

(Continued)

FOREIGN PATENT DOCUMENTS

| | | |
|---|---|---|
| JP | 2002-343599 | 11/2002 |
| WO | 2007/105428 | 9/2007 |

OTHER PUBLICATIONS

JP2002-343599, Ito et al., Plasma Generator, Nov. 29, 2002, [0008]-[0019], [0042]-0045].*

(Continued)

*Primary Examiner* — Sylvia MacArthur
*Assistant Examiner* — Michelle Crowell
(74) *Attorney, Agent, or Firm* — Katten Muchin Rosenman LLP

(57) ABSTRACT

[Object] To provide a plasma apparatus capable of igniting plasma reliably over a long period.
[Solution] The apparatus includes a hollow structural body (11) having a hollow structure along an axis, a first electrode (12) disposed inside the hollow structural body (11), and a second electrode (14) having a structure that externally covers a plasma generation area (13) of the hollow structural body (11). The first electrode (12) has a deformation structure (12*b*) within the plasma generation area of the hollow structural body.

14 Claims, 6 Drawing Sheets

(56) References Cited

U.S. PATENT DOCUMENTS

| | | | |
|---|---|---|---|
| 8,328,982 B1* | 12/2012 | Babayan et al. | 156/345.43 |
| 2002/0122896 A1* | 9/2002 | Kim et al. | 427/569 |
| 2009/0142514 A1* | 6/2009 | O'Neill et al. | 427/595 |
| 2012/0279519 A1* | 11/2012 | Swanson et al. | 134/1.1 |
| 2012/0292526 A1* | 11/2012 | Hiraoka et al. | 250/423 R |

OTHER PUBLICATIONS

International Search Report dated Jan. 31, 2012, from corresponding International Application No. PCT/JP2011/075482.

\* cited by examiner

PLASMA APPARATUS AND METHOD FOR PRODUCING THE SAME

TECHNICAL FIELD

The present invention relates to plasma apparatuses capable of igniting plasma stably over a long period.

BACKGROUND ART

Background Art

Plasma apparatuses are used to generate plasma for etching or cleaning a semiconductor circuit or bonding wires.

Japanese Unexamined Patent Application Publication No. 2002-343599, for example, discloses, as a specific structure of such plasma apparatuses, a plasma torch in which a glass tube having a narrow tip end is provided at a tip end of a metal tube, a high-frequency coil to which high-frequency power is supplied is wound around the glass tube, and a high-melting-point metal wire 8 extends through the glass tube (Patent Document 1). If a tip end portion of the wire comes into contact with the wall of the glass tube within a plasma generation area, the glass tube can have a hole and/or the tip end portion of the wire can be melted. To prevent such problems, the application proposes providing a bent portion or a coil-like portion in the wire short of the plasma generation area (see paragraphs 0042 to 0044 and FIGS. 5 and 6 of Patent Document 1).

Japanese Unexamined Patent Application Publication No. 2009-141211 discloses a plasma torch including a cylindrical tip end portion, a cylindrical glass introduction tube coupled to the tip end portion, an external electrode with which high-frequency power is supplied externally to the tip end portion, and an internal electrode extending from the glass introduction tube to the tip end portion through the cylindrical interior space (Patent Document 2). The internal electrode is provided in contact with the inner surface of the glass introduction tube (see paragraph 0026 and FIG. 3 of Patent Document 2).

RELATED ART DOCUMENTS

Patent Documents

Patent Document 1: Japanese Unexamined Patent Application Publication No. 2002-343599
Patent Document 2: Japanese Unexamined Patent Application Publication No. 2009-141211

SUMMARY OF THE INVENTION

Technical Problems

The inventors have found that such plasma generating apparatuses as disclosed in Patent Documents 1 and 2 have a highest plasma temperature near the center of the tube at which the high-frequency coil to be supplied with high-frequency power is positioned or the center of the tip end portion at which the external electrode to be supplied with high-frequency power is provided.

It is known that plasma ignition is facilitated with charge eccentricity around a minute apical portion existing in plasma gas. Such an apical portion corresponds to a fine surface unevenness that exists on the surface of the wire or the internal electrode from the beginning of production. Loss of such a fine surface unevenness can lead to loss of the ignition stability of generating plasma reliably over a long period.

In the plasma generating apparatuses disclosed in Patent Documents 1 and 2, the wire or the internal electrode is positioned near the center of the plasma torch at risk of relatively high-temperature plasma melting the surface of the wire or the internal electrode. The wire or the internal electrode, if the surface thereof is melted, no longer has any fine protrusion that facilitates plasma ignition, which gradually makes plasma ignition difficult to occur.

In consideration of the above-described problems, it is hence an object of the present invention to provide a plasma apparatus capable of igniting plasma stably over a long period.

Solutions to Problems

In order to achieve the foregoing object, the present invention is directed to a plasma apparatus having the following arrangement:

(1) including a hollow structural body having a hollow structure along an axis, a first electrode disposed inside the hollow structural body, and a second electrode having a structure that externally covers a plasma generation area of the hollow structural body, in which the first electrode has a deformation structure within the plasma generation area of the hollow structural body.

In accordance with the arrangement above, since the first electrode has a deformation structure within the plasma generation area of the hollow structural body, many parts of the first electrode are positioned off the vicinity of the axial center, which has a very high temperature upon plasma generation. This can prevent the fine unevenness on the surface of the first electrode from being melted and lost under high temperature, providing reliable plasma ignition.

The present invention can also have the following arrangements as required.

(2) In the above arrangement (1), the first electrode is in contact with an inner wall of the hollow structural body within the plasma generation area of the hollow structural body.

(3) In the above arrangement (1), it is preferable that the first electrode has a structure avoiding an inhibited space with a predetermined diameter centering on the axis of the hollow structural body within the plasma generation area of the hollow structural body.

(4) In the above arrangement (1) or (2), the deformation structure of the first electrode is a corrugated structure.

(5) In any of the above arrangements (1) to (3), the deformation structure of the first electrode is a coil-like structure.

(6) In any of the above arrangements (1) to (5), the hollow structural body is made of ceramic.

In order to achieve the foregoing object, the present invention is also directed to a method for producing a plasma apparatus having the following arrangements.

(7) The method of producing a plasma apparatus that is provided with a ground electrode inside a hollow structural body includes:

forming a deformation structure in a conductive linear member that configures the ground electrode;

inserting one end of the conductive linear member with the deformation structure provided therein through one end of the hollow structural body; and pulling the one end of the conductive linear member extending out through the other end of the hollow structural body to position the deformation structure formed in the conductive linear member within a plasma generation area of the hollow structural body, in which the step of forming the deformation structure includes forming the deformation structure before insertion into the hollow structural body to have a width equal to or greater than the inside diameter of the hollow structural body.

(8) In the above arrangement (7), the deformation structure of the ground electrode is a corrugated or coil-like structure.

Effects of Invention

In accordance with the present invention, the ground electrode is positioned avoiding the space in the vicinity of the axial center of the hollow structural body, which has a very high temperature upon plasma generation. This can prevent the fine unevenness on the surface of the ground electrode from being melted and lost under high temperature, providing reliable plasma ignition over a relatively long period.

BRIEF DESCRIPTION OF DRAWINGS

Exemplary embodiments of the present invention will be described in detail based on the following figures, wherein.

DESCRIPTION OF EMBODIMENTS

Exemplary embodiments of the present invention will hereinafter be described. In the following description of the drawings, identical or similar components are designated by the same or similar reference symbols. It is noted that the drawings are illustrative only and the dimensions and geometries are schematic only, and the technical scope of the present invention should not be understood as being limited to the embodiments.

First Embodiment

A first embodiment of the present invention relates to a plasma apparatus including a ground electrode that has a corrugated deformation structure.

Figure 1:
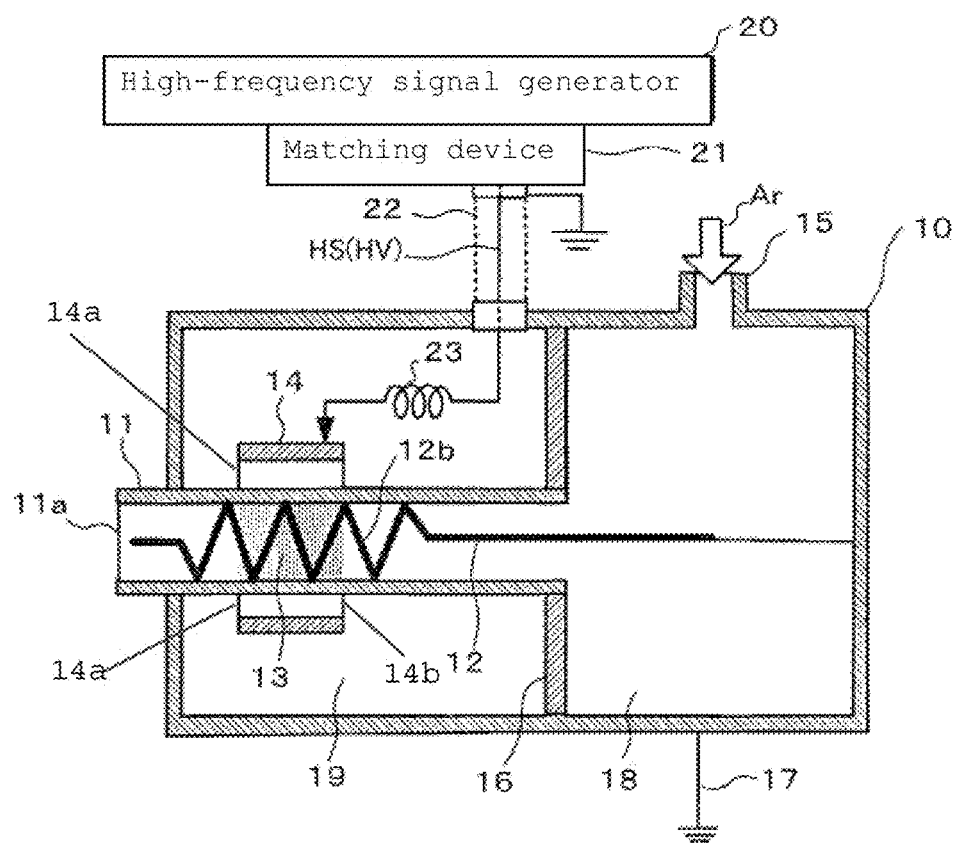
FIG. 1 is an overall configuration diagram of a plasma apparatus according to a first embodiment of the present invention.

FIG. 1 is an overall configuration diagram of a plasma apparatus according to the first embodiment. As shown in FIG. 1, the plasma apparatus 1 according to the first embodiment is configured to include a gas chamber 10, a hollow structural body 11, a ground electrode (first electrode) 12, a load electrode (second electrode) 14, and a grounding line 17. For example, the plasma apparatus 1 is disposed in a manner facing a surface to be cleaned of a semiconductor device and is used to generate plasma and clean the surface of the semiconductor device.

(Gas Chamber 10)

The gas chamber 10 is a gas-filled chamber for supplying plasma gas to the hollow structural body 11. The gas chamber 10 is divided by a partition wall 16 into a gas section 18 and an anterior section 19. The wall of the gas chamber 10 is made of metal to have electrical conductivity. The gas section 18 is configured to be supplied with plasma gas through a gas supply port 15.

$H_2$, $O_2$, $N_2$, or a mixture thereof with inert gas can be used as plasma gas for use in plasma generation. It is particularly preferable to use inert gas. The inert gas can be argon (Ar), helium (He), xenon (Xe), or neon (Ne) and, among them, argon (Ar) or helium (He) is used most frequently.

Plasma gas is supplied through a gas supply system including a gas cylinder, a compressor, a manometer, a flow meter, and a pipe arrangement, though not shown, to the plasma gas supply port 15 with being pressurized up to a predetermined pressure of, for example, 1 to 3 atmospheres.

It is noted that besides the configuration above, the plasma apparatus 1 can be configured as an atmospheric-pressure plasma apparatus that feeds plasma under an atmospheric ambient or as a vacuum (low-pressure) plasma apparatus that feeds plasma under a vacuum (low-pressure) ambient.

(Hollow Structural Body 11)

The hollow structural body 11 is a structure composed of an insulating material resistant to high temperature and high reactivity due to plasma generation, being formed in a cylindrical shape having a predetermined diameter WO in this embodiment. The hollow structural body 11, however, is not limited to have such a cylindrical shape, but can have another shape such as rectangular, polygonal, or elliptical as long as suitable for plasma generation. A variety of ceramics are preferred for the insulating material of the hollow structural body 11, as having relatively high thermal conductivity, thermal resistance, and plasma resistance. Silica glass or the like can also be used alternatively as the insulating material. A ground electrode 12 is provided inside the hollow structural body 11. Within the hollow interior of the hollow structural body 11, an area covered externally with the load electrode 14, i.e., between load electrode end 14a and load electrode end 14b serves as a plasma generation area 13. The hollow structural body 11 is installed in communication with the gas section 18 of the gas chamber 10, so that pressurized plasma gas in the gas section 18 can flow around the ground electrode 12 at high speed. During the application of plasma, a surface to be exposed to the plasma (e.g. surface to be cleaned of a semiconductor device) is disposed in a manner facing an end portion 11a of the hollow structural body 11.

(Load Electrode 14)

The load electrode 14 corresponds to the second electrode of the present invention, forming a pair with the ground electrode 12 and configured to be applied with a high-frequency signal HS (a high voltage HV) from a high-frequency signal generator 20. The load electrode 14 is formed in a manner externally covering the hollow structural body 11 to partially surround the ground electrode 12 and, in this embodiment, is formed in a cross-sectionally tubular shape (annular shape) to fit to the cylindrical hollow structural body 11. The interior of the hollow structural body 11 surrounded externally by the load electrode 14, i.e., between load electrode end 14a and load electrode end 14b, serves as the plasma generation area 13. The load electrode 14 is made of oxidation-resistant metal such as stainless or plated metal. The distance between the load electrode 14 and the ground electrode 12 is set based on the relationship between the power of a high-frequency signal to be applied and the density of plasma to be generated. The load electrode 14 can be formed not only in a cross-sectionally annular shape but also in a coil-like shape wound around the hollow structural body 11, for example.

(High-Frequency Signal Generator 20)

The high-frequency signal generator 20 is configured to generate a high voltage HV for igniting plasma and a high-frequency signal HS for generating and maintaining plasma, including, for example, a high-frequency power supply, a forward-wave/reflected-wave detector, a high-voltage generator, and a superposed coil, though not shown. The high voltage HV is supplied at a value of, for example, about 0.8 to 2 kV at which to provide discharge sufficient to excite plasma in the loaded plasma gas. The frequency of the high voltage HV is, for example, 1 kHz and the supplied voltage at the frequency is 1 kV. The high-frequency signal HS is supplied at a frequency of, for example, about 10 kHz to 1 GHz suitable for generating and maintaining plasma and at a power of, for example, about 0.1 to 100 W suitable for generating and maintaining plasma, though vary depending on the specification of the plasma apparatus.

(Matching Device 21)

A matching device 21 is provided on a transmission path between the high-frequency signal generator 20 and the load electrode 14 to serve for impedance matching between the high-frequency signal generator 20 and the load electrode 14. The matching device 21 has a filter circuit configuration including a coil and a variable capacitor, and is designed such that the load impedance with stably generated plasma has a characteristic impedance $Z_0$ (e.g. 50Ω) when viewed from the output side of the high-frequency signal generator 20.

(Coaxial Cable 22)

A coaxial cable 22 is provided as a transmission path of the characteristic impedance $Z_0$ for supplying the high-frequency signal HS from the high-frequency signal generator 20 to the load electrode 14. The coaxial cable 22 is connected, via a connector, to the matching device 21 and the anterior section 19, and the covering of the coaxial cable 22 is grounded in at least one of the matching device 21 and the anterior section 19.

(Reactance Correction Coil 23)

A reactance correction coil 23 is connected as an inductor element between the matching device 21 and the load electrode 14. The reactance correction coil 23 serves to limit the influence of a reactance (impedance) caused by a capacitance component that exists between the load electrode 14 and the ground electrode 12 and thereby to improve the voltage standing wave ratio (VSWR).

(Structure of the Ground Electrode 12)

The ground electrode 12 corresponds to the first electrode of the present invention, forming a pair with the load electrode 14 and grounded to generate plasma. The ground electrode 12 is provided within the hollow interior of the hollow structural body 11. The ground electrode 12 is composed of a conductive linear member, such as a platinum or tungsten wire, having a high melting point so as to be resistant to high-temperature plasma generated therearound. The ground electrode 12 is grounded electrically with the grounding line 17 through the wall of the gas section 18.

Figure 2:
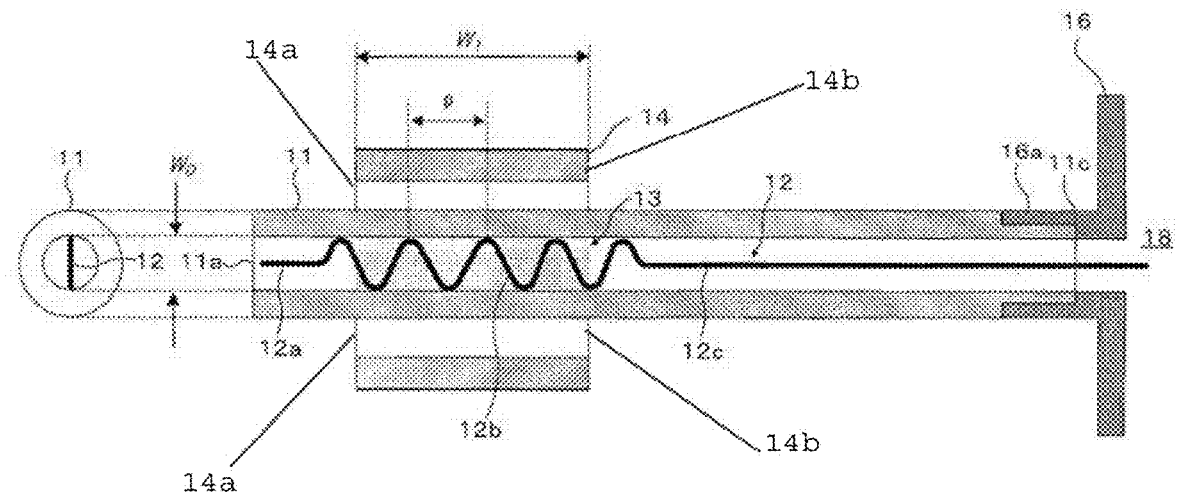
FIG. 2 is a cross-sectional view illustrating the structure of the plasma apparatus according to the first embodiment of the present invention.

FIG. 2 is a cross-sectional view illustrating the detailed structure of the ground electrode 12 installed within the hollow interior of the hollow structural body 11. In FIG. 2, the right is a cross-sectional view of the hollow structural body 11 along the axial center, and the left is a front view on one end portion 11a (leading end) of the hollow structural body 11.

As shown in FIG. 2, the hollow structural body 11 has a hollow structure with an inside diameter $W_0$. The other end portion 11c of the hollow structural body 11 is fitted in an opening 16a provided in the partition wall 16, so that the hollow interior is in communication with the gas section 18. Accordingly, the ground electrode 12 is installed within the hollow interior of the hollow structural body 11, which is in communication with the gas section 18.

In particular, the ground electrode 12 is characterized by having a deformation structure 12b within at least the plasma generation area 13. The ground electrode 12 has a linear portion 12a along the axial center on the leading end side, that is, on the side of the end portion 11a with respect to the plasma generation area 13, and also has a linear portion 12c along the axial center on the base end side (the gas section 18), that is, on the side of the end portion 11c with respect to the plasma generation area 13.

In particular, the deformation structure 12b is a corrugated structure in this first embodiment. As clearly shown in the front view of FIG. 2, the corrugated deformation structure 12b is formed as a two-dimensional corrugation in a plane containing the axial center. The deformation structure 12b can be formed to be longer than the length $W_1$ of the plasma generation area 13. The corrugation of the deformation structure 12b has a regular pitch "p". It is however not necessary for the pitch "p" to be constant throughout the length of the deformation structure 12b.

Figure 3:
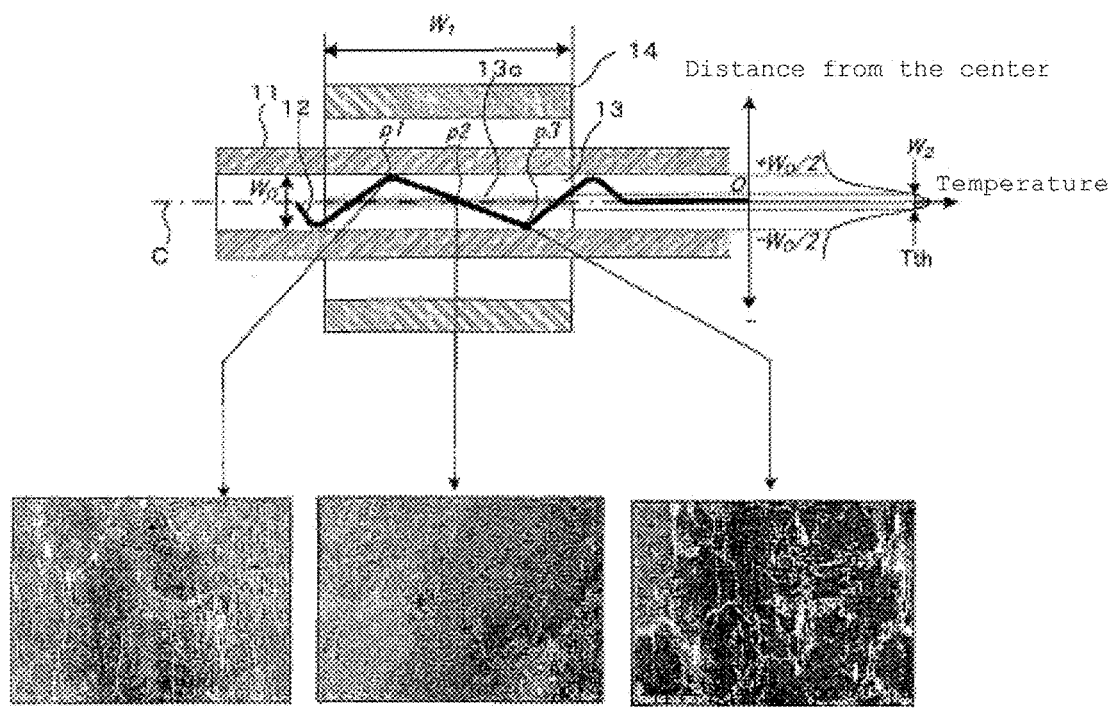
FIG. 3 illustrates a temperature distribution inside a hollow structural body of the present invention.

FIG. 3 is a cross-sectional view illustrating a temperature distribution within the hollow interior of the hollow structural body 11. As shown in FIG. 3, plasma is generated within the plasma generation area 13 inside the hollow structural body 11 covered externally with the load electrode

14. As mentioned above, plasma is ignited with charge eccentricity around a fine surface unevenness that the surface of the ground electrode 12 has from the beginning of production. As shown in FIG. 3, the ignited plasma has a temperature distribution in which the temperature is highest on the axial center C and decreases with an increase in the distance from the axial center C. Within a space 13c having a width $W_2$ centering on the axial center C, the plasma temperature is higher than a threshold temperature $T_{th}$ above which the ground electrode 12 can be melted, while outside the space 13c, the plasma temperature is equal to or lower than the threshold temperature $T_{th}$ above which the ground electrode 12 can be melted. For this reason, if the ground electrode 12 is disposed within the space 13c, the surface can be melted, while if disposed outside the space 13c, the surface cannot be melted.

Photos are shown, below in FIG. 3, of the surface of the ground electrode 12 taken using a scanning electron microscope (SEM) after several plasma generations in an actual plasma apparatus. It is clearly observed that at the point p2 on the axial center C, the surface of the ground electrode has been melted and thereby the flaws on the metal surface and/or the grain boundary of the metal crystal have been lost, while at the points P1 and P3 in the vicinity of the wall of the hollow structural body, the flaws on the metal surface and/or the grain boundary of the metal crystal still remain. If the ground electrode is thus disposed in the vicinity of the axial center, the fine unevenness, which is necessary for plasma ignition, will be lost over time.

In conventional plasma apparatuses, the ground electrode is disposed on the axial center C, and it is therefore often the case that after repeated plasma generations, the surface of the ground electrode is melted and thereby the fine unevenness is lost. It is thus impossible to generate plasma stably over a long period. When it is no longer possible to ignite plasma, it is necessary to replace the ground electrode, which forces conventional plasma apparatuses to undergo frequent replacement of the ground electrode.

Hence, in this first embodiment, the corrugated deformation structure 12b is provided in the ground electrode 12 within the plasma generation area 13. Many parts of the thus provided deformation structure 12b are positioned outside the space 13c, that is, in an area in which the plasma temperature is equal to or lower than the threshold temperature $T_{th}$ above which the metal can be melted. This can prevent the fine unevenness on the surface of the ground electrode 12 from being melted and lost. The space 13c will hereinafter be referred to as "inhibited space" within which the ground electrode 12 should not be disposed.

It is noted that in this first embodiment, although the deformation structure 12b is formed in a corrugation that traverses the axial center C and therefore partially traverses the inhibited space 13c, many parts of the ground electrode 12 are positioned outside the inhibited space 13c and thus there is no possibility of failure in plasma ignition even if the surface portion of the electrode within the inhibited space 13c can be melted.

(Description of the Operation)

Next will be described the operation of the plasma apparatus 1 according to the first embodiment.

In a preparatory state for plasma ignition (hereinafter referred to as "plasma standby state"), plasma gas is supplied through the gas supply port 15 into the gas chamber 10 under control by a controller not shown or through an operation by an administrator. The thus supplied plasma gas, with which the gas section 18 of the gas chamber 10 is filled, flows inside the hollow structural body 11 at a predetermined pressure. After the flow of the plasma gas is stabilized, a plasma ignition command is output to the high-frequency signal generator 20.

The high-frequency signal generator 20 determines whether or not the system status is in the plasma standby state. If the status is not in the plasma standby state, which means being not prepared for plasma ignition, the high-frequency signal generator 20 gives a warning about it. If the status is in the plasma standby state, the high-frequency signal generator 20 outputs a high-frequency signal HS having a frequency of 450 MHz and a power of 30 W onto the transmission path. When the high-frequency signal HS is supplied, a high-frequency electromagnetic wave is induced between the load electrode 14 and the ground electrode 12.

When the high-frequency signal HS is supplied, the matching device 21 provides impedance matching control between the output of the high-frequency signal generator 20 and the load electrode 14. The high-frequency signal generator 20 detects on the transmission path the forward-wave amplitude value $V_f$ of the high-frequency signal HS and the reflected-wave amplitude value $V_r$ from the load electrode 14 to calculate a VSWR value. During existence of appropriate plasma, the matching device 21 will serve to make the load impedance of the load electrode 14 have the same value as the characteristic impedance of the high-frequency signal generator 20. However, in this pre-plasma stage, the load impedance of the load electrode 14 is considerably different from the characteristic impedance $Z_0$. As a result, the detected reflected-wave amplitude value $V_r$ is high and, accordingly, the VSWR value is also relatively high.

Next, if it is determined that the calculated VSWR value is higher than a threshold value $V_{th}$ for identifying the generation of plasma, the high-frequency signal generator 20 starts to supply a high voltage HV. The generated high voltage HV is superimposed on the high-frequency signal HS and output to the transmission path. The high voltage HV, when superimposed on the high-frequency signal HS, is also applied between the load electrode 14 and the ground electrode 12, resulting in charge concentration and discharge around the fine unevenness on the surface of the ground electrode 12 within the plasma generation area 13 of the hollow structural body 11. The discharge causes to generate plasma through electrons pilot. The generated plasma is maintained by the high-frequency signal HS applied on the load electrode 14. After the generated plasma is stabilized, a plasma jet can be fed, as required, from the end portion 11a of the hollow structural body 11 onto the surface of a semiconductor device or the like. After the plasma generation, the load impedance of the load electrode 14 converges to the characteristic impedance $Z_0$.

When the VSWR value becomes equal to or lower than the threshold value $V_{th}$, the high-frequency signal generator 20 stops superimposing the high voltage HV, so that only the high-frequency signal HS is supplied onto the transmission path. In this stage, the plasma is generated stably and cannot disappear even if the high voltage HV can thus not be superimposed.

In accordance with this first embodiment, since the deformation structure 12b is formed in the ground electrode 12 within the plasma generation area 13, the fine surface unevenness cannot disappear even after such repeated plasma ignition operations. It is therefore possible to repeat plasma ignition stably over a long period.

(Method for Producing a Plasma Apparatus)

Next will be described a preferred method for producing such a plasma apparatus as mentioned above. FIGS. 4 to 8 are cross-sectional views illustrating, about the axial center C of the hollow structural body 11, the steps included in the method for producing the plasma apparatus according to the first embodiment.

(Deformation Structure Forming Step)

Figure 4:
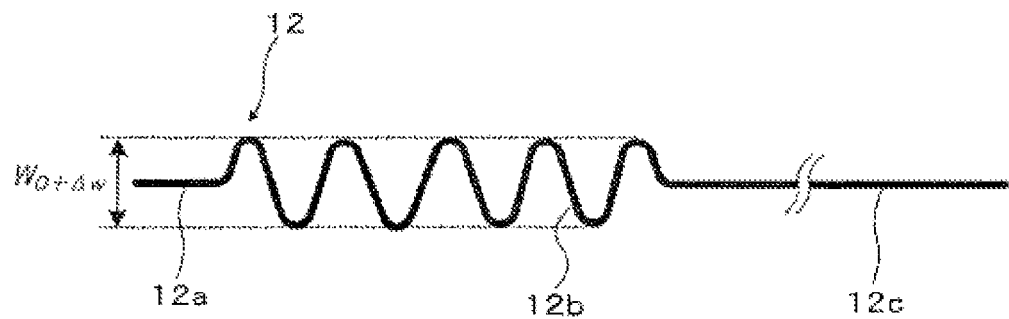
FIG. 4 is a cross-sectional view illustrating the step of forming a deformation structure in a ground electrode, the step included in a method for producing the plasma apparatus according to the first embodiment of the present invention.

FIG. 4 shows the step of forming the deformation structure in the ground electrode.

As shown in FIG. 4, in this ground electrode forming step, the deformation structure 12b will be formed in the conductive linear member that constitutes the ground electrode 12. To this end, the conductive linear member, a material for the ground electrode 12, is cut to have a predetermined length. It is preferable that the conductive linear member is composed of a metal material, such as platinum or tungsten, having a high melting point so as to be resistant to high-temperature plasma. The linear member has a size (diameter) enough to be housed inside the hollow structural body 11 with the deformation structure, the size to be defined appropriately depending on the size of the hollow structural body 11.

It is preferable that the member is cut to have a length enough to be processed easily. The final product is only required to be long enough that the ground electrode 12 with the deformation structure 12b provided therein can be housed in the hollow structural body 11 and attached to the partition wall 16 of the gas chamber 10 as well as the linear portion 12c of the ground electrode 12 can be grounded to the inner wall of the gas section 18. It is however necessary to secure a length to grasp so that in the pulling step to be described hereinafter, the linear portion 12c of the linear member can be grasped with tweezers and applied with a tension before the ground electrode 12 is housed in the hollow structural body 11. That is, the conductive linear member is cut such that excluding the deformation structure 12b, the linear portion 12c has a length equal to the length of the hollow structural body 11 added with a length that can be grasped with tweezers.

The deformation structure 12b is then formed in the thus cut conductive linear member within a portion corresponding to the plasma generation area 13 when installed in the hollow structural body 11. In this embodiment, the position to form the deformation structure 12b of the ground electrode 12 is defined as the distance from the linear portion 12a on the leading end side so that the linear portion 12c on the grounding end side can be applied with a tension.

The deformation structure 12b is a regularly corrugated structure. It is possible to form a desired corrugation having a desired wave number and pitch, which corresponds to the wave period of the corrugation. It is preferable to format least three mountains (peaks or local maximum points). If there are at least three mountain peaks, the deformation structure 12b can be in contact with the inner wall of the hollow structural body 11 at the three points and thereby can be installed stably.

As for the axial length of the deformation structure 12b during formation, the pre-installation length of the deformation structure 12b is set to be slightly smaller than the post-installation length on the assumption that in the pulling step to be described hereinafter, the deformation structure 12b is deformed and thereby the conductive linear member is stretched in the pulling direction.

It is preferable that the width of the corrugation, which corresponds to the wave amplitude, is formed to be equal to or greater than the inside diameter of the hollow structural body 11 and, in this embodiment, to be greater than the inside diameter $W_0$ of the hollow structural body 11 by a certain quantity ($\Delta w$) with which the corrugation can be housed within the inner wall of the hollow structural body 11 through sufficient flattening deformation of the wave peaks caused by a tension that is applied by pulling the linear portion 12c of the linear member in the pulling step to be described hereinafter. Thus housing in the hollow structural body 11 the deformation structure 12b formed to have a width slightly greater than the inside diameter $W_0$ of the hollow structural body 11 allows the deformation structure 12b to be fixed stably, within the plasma generation area 13, in a manner urging the inner wall on both sides with an elastic force of the conductive linear member due to deformation.

(Inserting Step)

Figure 5:
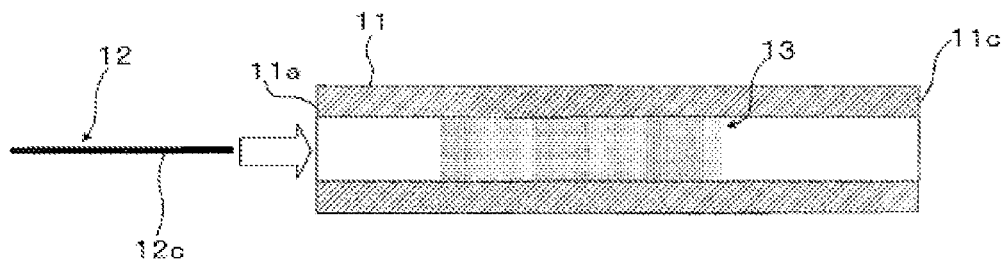
FIG. 5 is a cross-sectional view illustrating the first step of inserting the ground electrode, the step included in the method for producing the plasma apparatus according to the first embodiment of the present invention.
Figure 6:
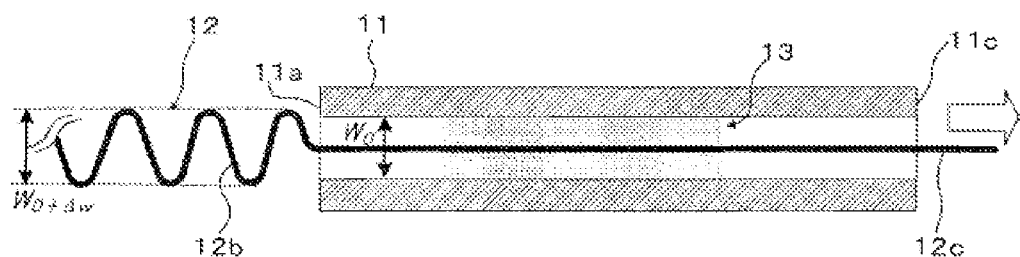
FIG. 6 is a cross-sectional view illustrating the second step of inserting the ground electrode, the step included in the method for producing the plasma apparatus according to the first embodiment of the present invention.

FIGS. 5 and 6 show the step of inserting the ground electrode.

As shown in FIG. 5, in this inserting step, the linear portion 12c of the conductive linear member with the deformation structure 12b provided therein is inserted through the end portion 11a of the hollow structural body 11 on the leading end side. In this embodiment, the linear portion 12c of the conductive linear member is cut to be longer. As shown in FIG. 6, this results in that the end portion of the conductive linear member inserted through the one end portion 11a of the hollow structural body 11 extends out through the other end portion 11c. The insertion is continued until the deformation structure 12b of the conductive linear member formed to have a slightly greater width comes into contact with the end portion 11a of the hollow structural body 11 on the leading end side.

(Pulling Step)

Figure 7:
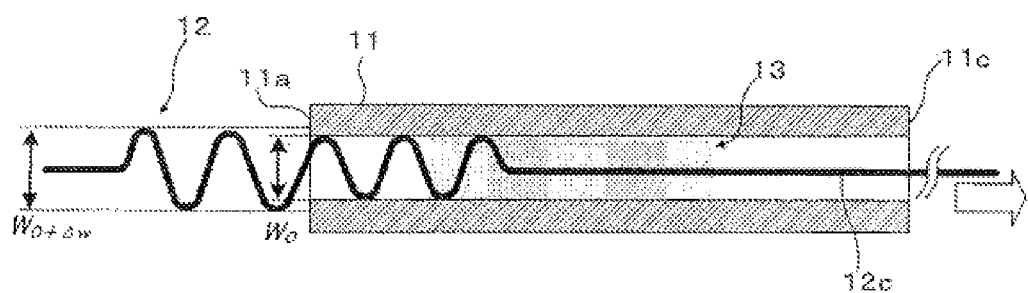
FIG. 7 is a cross-sectional view illustrating the step of pulling the ground electrode, the step included in the method for producing the plasma apparatus according to the first embodiment of the present invention.

FIG. 7 shows the step of pulling the ground electrode.

As shown in FIG. 7, in this pulling step, the linear portion 12c of the conductive linear member extending out through the other end portion 11c of the hollow structural body 11 is pulled to position the deformation structure 12b formed in the conductive linear member within the plasma generation area 13 of the hollow structural body 11.

Specifically, when the linear portion 12c of the conductive linear member extends out through the other end portion 11c of the hollow structural body 11 and the deformation structure 12b comes into contact with the end portion 11a of the hollow structural body 11, the linear portion 12c is grasped with tweezers and applied slowly with a tension in the direction of the arrow shown in FIG. 7. Thus applying the tension causes the mountain portions of the corrugated deformation structure 12b in contact with the end portion 11a of the hollow structural body 11 to be deformed elastically and, as shown in FIG. 7, to have a reduced width equal to the inside diameter $W_0$ of the hollow structural body 11 to enter the hollow interior of the hollow structural body 11. After all the corrugated mountains enter the hollow interior of the hollow structural body 11, the deformation structure 12b is further slid until the major portion thereof comes within the plasma generation area 13.

Figure 8:
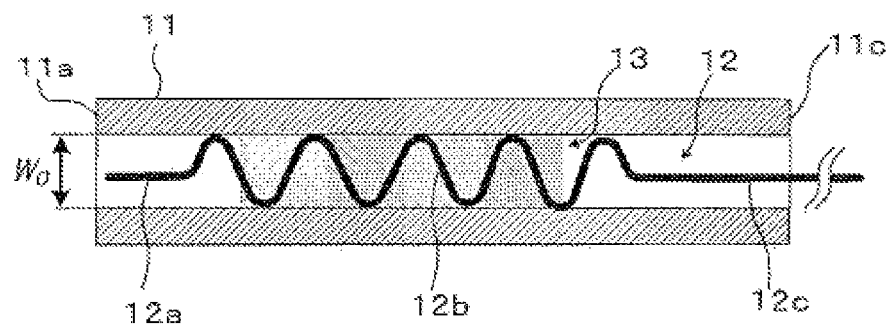
FIG. 8 is a cross-sectional view illustrating the step after the completion of the installation of the ground electrode, the step included in the method for producing the plasma apparatus according to the first embodiment of the present invention.

FIG. 8 shows a state where the major portion of the deformation structure 12b comes within the plasma generation area 13. After the major portion of the deformation structure 12b of the conductive linear member comes within the plasma generation area 13, the pulling step is terminated.

Finally, the hollow structural body 11 with the ground electrode 12 installed therein will be fixed to the plasma apparatus 1. As shown in FIG. 2, the linear portion 12c of the conductive linear member is inserted through the opening 16a provided in the partition wall 16 into the gas section 18, and then the conductive linear member is cut to have a proper length. The cut end portion is then connected and grounded electrically to the conductive wall of the gas section 18. Finally, as shown in FIG. 2, the end portion 11c of the hollow structural body 11 is fitted into the opening 16a of the partition wall 16 to complete the plasma apparatus 1.

It is noted that although the linear portion 12c of the conductive linear member is pulled in the pulling step above, the linear portion 12a on the leading end side can be pulled. In the case of pulling the linear portion 12a, the conductive linear member is cut such that the linear portion 12a has a length equal to the length of the hollow structural body 11 added with a length that can be grasped with tweezers. The linear portion 12a of the conductive linear member is then inserted through the end portion 11c of the hollow structural body 11 on the base end side (near the gas chamber) and, after extending out through the end portion 11a of the hollow structural body 11 on the leading end side, is pulled.

Advantages of the First Embodiment

This first embodiment has the following advantages.

(1) In accordance with this first embodiment, since the deformation structure 12b is provided within the plasma generation area 13 of the hollow structural body 11, many parts of the ground electrode 12 are positioned off the vicinity of the axial center C (the inhibited space 13c having a width $W_2$), which has a very high temperature upon plasma generation. This can prevent the fine unevenness on the surface of the ground electrode 12 from being melted and lost under high temperature, providing reliable plasma ignition.

(2) In accordance with this first embodiment, since the ground electrode 12 is in contact with the inner wall of the hollow structural body 11 within the plasma generation area 13 of the hollow structural body 11, it is possible to dissipate the heat of the ground electrode 12 through the hollow structural body 11. Particularly, in accordance with this first embodiment, since the hollow structural body 11 is made of ceramic, the thermal conductivity of which is higher than that of glass, the contact with the inner wall of the hollow structural body 11 allows for effective heat dissipation.

(3) In accordance with this first embodiment, the ground electrode 12 has a structure avoiding as much as possible the inhibited space 13c having a width $W_2$ within the plasma generation area 13 of the hollow structural body 11. That is, the number of times the linear member, with the corrugated deformation structure 12b provided therein, traverses the inhibited space 13c is limited to a small range. As a result, most parts of the ground electrode 12 within the plasma generation area 13 have a temperature equal to or lower than the threshold temperature $T_{th}$ above which the surface of the ground electrode 12 can be melted. This can prevent the fine unevenness on the surface of the ground electrode 12 from being melted and lost under high temperature, providing reliable plasma ignition over a relatively long period.

(4) In accordance with this first embodiment, the deformation structure 12b of the ground electrode 12, which is a corrugated structure, can be formed relatively easily. Having the corrugated deformation structure 12b allows the number of the corrugated mountains and/or the length of the deformation structure 12b to be adjusted relatively easily in the deformation structure forming step, which also facilitates the installation in the pulling step.

(5) In accordance with this first embodiment, since the deformation structure 12b of the conductive linear member, which is formed to have a width ($W_0+\Delta w$) slightly greater than the inside diameter $W_0$ of the hollow structural body 11, is pulled to be installed within the hollow interior of the hollow structural body 11, the ground electrode 12 can be fixed stably inside the hollow structural body 11 in a manner that the deformation structure 12b urges the inner wall on both sides with an elastic force of the conductive linear member due to deformation within the plasma generation area 13. In addition, the mountain peaks of the deformation structure 12b are pressed by the elastic force against the inner wall of the hollow structural body 11, which can increase the contact area between the ground electrode 12 and the hollow structural body 11 to thereby improve the heat dissipation efficiency.

Second Embodiment

Although the above-described first embodiment employs a corrugated deformation structure in the ground electrode, this second embodiment employs a coil-like deformation structure.

Figure 9:
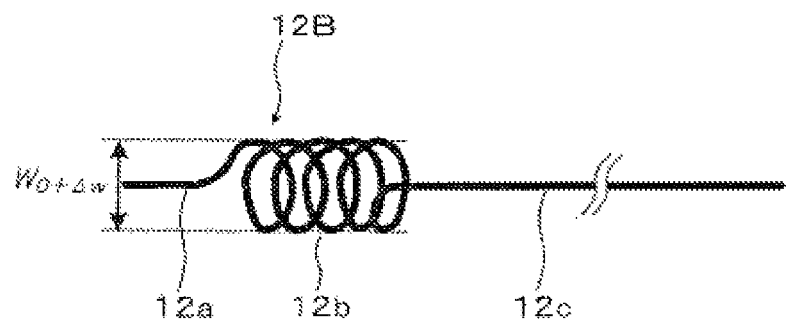
FIG. 9 is perspective view illustrating a deformation structure in a ground electrode according to a second embodiment of the present invention.
Figure 10:
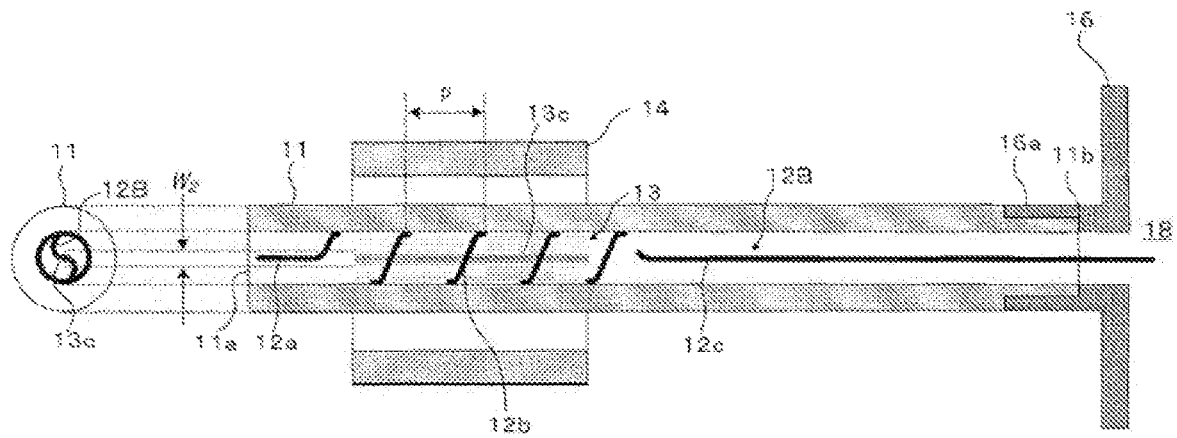
FIG. 10 is a cross-sectional view illustrating the structure of a plasma apparatus according to the second embodiment of the present invention.

FIG. 9 is perspective view illustrating a ground electrode 12B according to this second embodiment. FIG. 10 is a cross-sectional view illustrating the detailed structure of the ground electrode 12B installed within the hollow interior of the hollow structural body 11. In FIG. 10, the right is a side cross-sectional view, and the left is a front view.

As is the case with the ground electrode 12 in the above-described first embodiment, the ground electrode 12B according to this second embodiment also corresponds to the first electrode of the present invention, forming a pair with the load electrode 14 and grounded to generate plasma. As is the case in the above-described first embodiment, the ground electrode 12B has a linear portion 12a along the axial center on the side of the end portion 11a with respect to the plasma generation area 13, and also has a linear portion 12c along the axial center on the base end side (near the gas chamber 10), that is, on the side of the end portion 11b with respect to the plasma generation area 13, the electrode provided within the hollow interior having an inside diameter $W_0$ of the hollow structural body 11. The end portion 11b of the hollow structural body 11 is fitted in the opening 16a provided in the partition wall 16, so that the hollow interior is in communication with the gas section 18. The linear portion 12c of the ground electrode 12B is grounded electrically with the grounding line 17 through the wall of the gas section 18. The ground electrode 12B is composed of a conductive linear member, such as a platinum or tungsten wire, having a high melting point.

Particularly, the ground electrode 12B according to this second embodiment is characterized by having a coil-like deformation structure 12b. As clearly shown in FIG. 10, the coil-like deformation structure 12b avoids the inhibited space 13c having a width (diameter) $W_2$ centering on the axis C of the hollow structural body 11 within the plasma generation area 13 of the hollow structural body 11. As also is the case in the above-described first embodiment, it is preferable that the coil-like deformation structure 12b is formed to be longer than the length $W_1$ of the plasma generation area 13. The deformation structure 12b is wound at a regular pitch "p". It is however not necessary for the pitch "p" to be constant throughout the length of the deformation structure 12b.

Not only having the same advantages as the above-described first embodiment, this second embodiment can also effectively prevent the fine unevenness required for plasma ignition on the surface of the ground electrode 12B from being melted and lost over time because the deformation structure 12b of the ground electrode 12B employs a coil-like structure and thereby the ground electrode 12B cannot exist within the inhibited space 13c, which has a temperature higher than the threshold temperature $T_{th}$ above which the ground electrode 12B can be melted. It is therefore possible to provide a plasma apparatus capable of igniting plasma reliably over a longer period.

Third Embodiment

This third embodiment provides an exemplary variation of the corrugated deformation structure of the ground electrode according to the above-described first embodiment.

Figure 11:
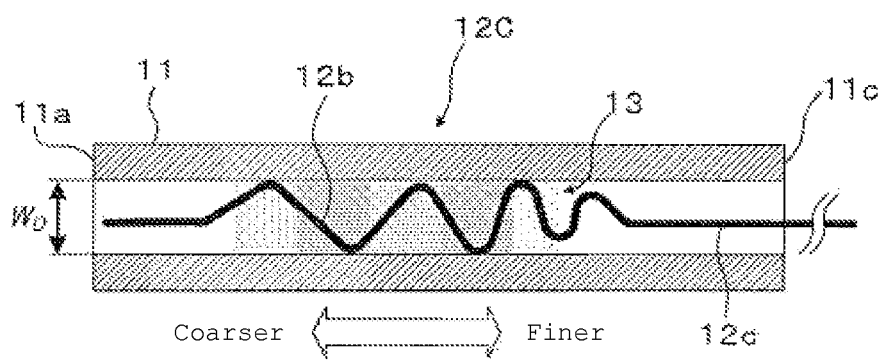
FIG. 11 is a cross-sectional view illustrating a deformation structure in a ground electrode according to a third embodiment of the present invention.

FIG. 11 is a cross-sectional view illustrating the structure of a ground electrode 12C installed within the hollow interior of the hollow structural body 11. In this third embodiment, the deformation structure 12b of the ground electrode 12C is formed in a similar corrugation as in the above-described first embodiment, but differs from that in the above-described first embodiment in that the pitch of corrugated mountains is not regular as shown in FIG. 11. The other structure, which is the same as that in the above-described first embodiment, will not be described below.

Specifically, in this third embodiment, the corrugated deformation structure 12b of the ground electrode 12C has a finer pitch nearer the base end side (gas chamber 10), while has a coarser pitch nearer the leading end side. The deformation structure 12b can thus not have a regular pitch as long as having multiple flexed portions and grounded stably within the hollow interior of the hollow structural body 11.

It is noted that some of the corrugated mountains of the deformation structure 12b can not be in contact with the inner wall of the hollow structural body 11. This is for the reason that the surface of the ground electrode 12C cannot be melted as long as avoiding the inhibited space 13c, which has a temperature higher than the threshold temperature $T_{th}$ above which the ground electrode 12C can be melted.

Neither directionality nor regularity is required for the coarseness and fineness of the corrugation. The coarseness and fineness of the corrugation can be in reverse of that shown in FIG. 11 or only a portion of the corrugation can be fine or coarse.

Further, such a coil-like structure as described above in the second embodiment can have a coarse and fine pitch. In this case, neither directionality nor regularity is required for the coarseness and fineness of the coil-like structure. The coarseness and fineness of the coil-like structure can be in reverse of that shown in FIG. 11 or only a portion of the coil-like structure can be fine or coarse.

These kinds of coarseness and fineness can occur in the process of producing a plasma apparatus described above in the first embodiment. This is for the reason that even if in the deformation structure forming step, a regular corrugation or coil-like structure can be formed as the deformation structure 12b, the degree of pulling at every point of the deformation structure 12b in the pulling step depends on locally different frictions between the inner wall of the hollow structural body 11 and the deformation structure 12b.

This third embodiment has the same advantages as the above-described first embodiment.

Fourth Embodiment

Unlike the corrugated structure in the above-described first embodiment or the coil-like structure in the above-described second embodiment, this fourth embodiment employs a rectangular deformation structure.

Figure 12:
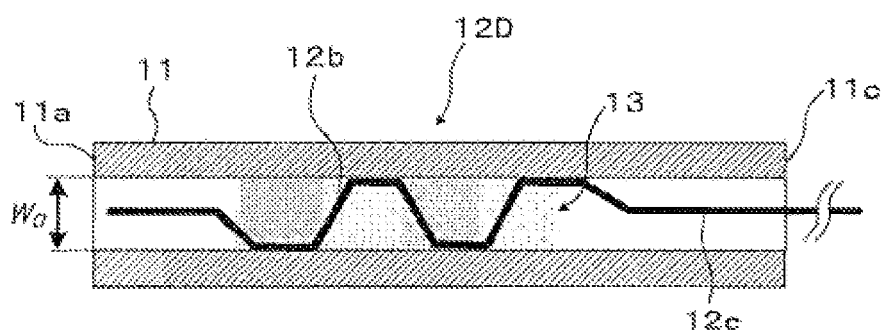
FIG. 12 is a cross-sectional view illustrating a deformation structure in a ground electrode according to a fourth embodiment of the present invention.

FIG. 12 is a cross-sectional view illustrating the structure of a ground electrode 12D installed within the hollow interior of the hollow structural body 11. The ground electrode 12D according to this fourth embodiment differs from those in the above-described embodiments in that the deformation structure 12b is formed in a rectangular shape. The other structure, which is the same as that in the above-described first embodiment, will not be described below.

Specifically, in this fourth embodiment, the deformation structure 12b of the ground electrode 12D is formed to have a series of rectangular shapes. In particular, the deformation structure 12b thus having a rectangular shape can increase the contact area between the ground electrode and the inner wall of the hollow structural body 11 to thereby improve the heat dissipation efficiency.

In addition, since the ground electrode 12D is in contact with the inner wall of the hollow structural body 11 via a relatively large contact area, it is possible to install the ground electrode 12D stably in the hollow structural body 11.

A similar production method as above can be used to produce a plasma apparatus that includes a ground electrode 12D having such a deformation structure 12b. For example, in the deformation structure forming step of the process of producing a plasma apparatus, the deformation structure 12b is prepared such that the flexed portions have an approximately right angle. In the pulling step, when the end portion 12c of the ground electrode 12D is pulled, the rectangular shapes of the deformation structure 12b are drawn out to be trapezoidal, as shown in FIG. 12, and installed within the plasma generation area 13.

It is noted, as described above in the third embodiment, that the pitch of the rectangular shapes can not necessarily be regular, but can partially be coarse or fine. In addition, some of the rectangular shapes can not be in contact with the inner wall of the hollow structural body 11.

Not only having the same advantages as the above-described first embodiment, this fourth embodiment can also increase the contact area between the inner wall of the hollow structural body 11 and the ground electrode 12D to thereby improve the heat dissipation efficiency.

Further, in accordance with this fourth embodiment, since the ground electrode 12D is in contact with the inner wall of the hollow structural body 11 via a relatively large contact area, it is possible to install the ground electrode 12D more stably in the hollow structural body 11.

Fifth Embodiment

Unlike the repetitive deformation structures in the above-described embodiments, this fifth embodiment provides a ground electrode having a deformation structure effectively and stably installable with a minimum number of contact points.

Figure 13:
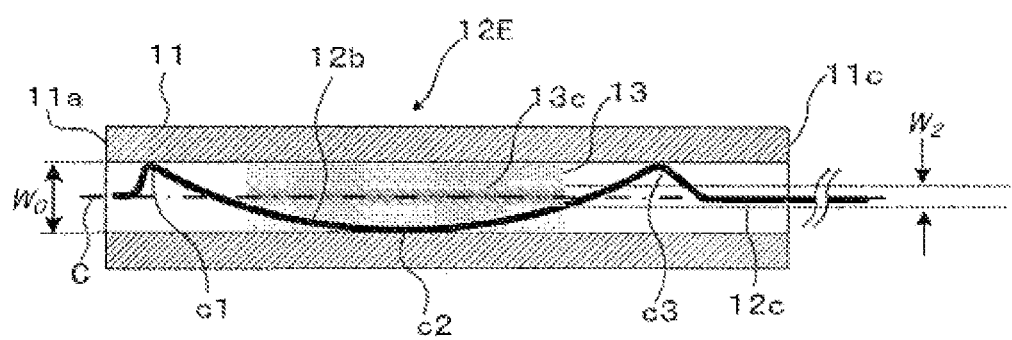
FIG. 13 is a cross-sectional view illustrating a deformation structure in a ground electrode according to a fifth embodiment of the present invention.

FIG. 13 is a cross-sectional view illustrating the structure of a ground electrode 12E installed within the hollow interior of the hollow structural body 11. As shown in FIG. 13, the ground electrode 12E according to this fifth embodiment includes a deformation structure 12b having three flexed portions c1, c2, and c3. The flexed portions c1 and c3 are provided anterior and posterior to the plasma generation area 13 and in contact with the inner wall of the hollow structural body 11. The flexed portion c2 is in contact with the inner wall of the hollow structural body 11 in the middle of the plasma generation area 13. The flexed portions c1 and c3 are positioned and set covertures such that the ground electrode 12E can be flexed sufficiently on the outside of the plasma generation area 13 so as to avoid the inhibited space 13c of the plasma generation area 13.

In the deformation structure forming step, the width between the flexed portions c1 and c2 and the flexed portion c3 is arranged to be sufficiently greater than the inside diameter $W_0$ of the hollow structural body 11, which allows, after the installation of the ground electrode 12E in the pulling step, the flexed portion c2 to come into contact with the inner wall of the hollow structural body 11 at a moderate stress, improving the heat dissipation efficiency.

Not only having the same advantages as the above-described first embodiment, this fifth embodiment can also completely avoid the inhibited space 13c of the plasma generation area 13 while the ground electrode 12E is installed stably within the interior of the hollow structural body 11 with a minimum number of flexed portions.

(Other Exemplary Variations)

The present invention is not limited to the above-described embodiments, and can also be applied as a practical example on an appropriate combination thereof or an applicative example with a modification or an improvement added thereto for any application or purpose, and thus should not be understood to be limited to the practical examples described above in the embodiments of the present invention. The practical or applicative example including an appropriate combination for any application or purpose also lies within the technical scope of the present invention without departing from the subject of the invention.

For example, the deformation structure is not limited to the corrugated, coil-like, or rectangular structure described above in the embodiments. Every aspect lies within the technical scope of the present invention in which the ground electrode is deformed positively to avoid as much as possible the inhibited space of the plasma generation area.

INDUSTRIAL APPLICABILITY

The plasma apparatus according to the present invention is applicable not only to surface cleaning apparatuses for cleaning the surface of a semiconductor device, but also to every application that uses plasma, such as asking, etching, CVD, and sputtering.

REFERENCE MARKS IN THE DRAWINGS

1 Plasma apparatus
10 Gas chamber
11 Hollow structural body (ceramic tube)
11a, 11b, 11c End portions
12, 12B to 12E Ground electrodes
12a, 12c Linear portions
12b Deformation structure
13 Plasma generation area
13c Inhibited space
14 Load electrode
15 Gas supply port
16 Partition wall
16a Opening
17 Grounding line
18 Gas section
19 Anterior section
20 High-frequency signal generator
21 Matching device
22 Coaxial cable
23 Reactance correction coil
HS High-frequency signal
HV High voltage

The invention claimed is:

1. A capacitively coupled plasma apparatus comprising:
a hollow structural body comprising a cylindrical-shaped ceramic, the hollow structural body comprising a plasma generation area inside the hollow structural body;
a first electrode comprising a conductive wire member disposed in one plane, the first electrode being disposed inside the hollow structural body; and
a second electrode formed as a hollow conductive cylindrical member, the conductive cylindrical member having a first end and a second end, the first end and the second end defining therebetween limits of the plasma generation area inside the hollow structural body;
wherein the first electrode has a non-linear structure that has a portion disposed in an area of an outer circumferential side from a predetermined diameter centering on an axis of the hollow structural body within at least the plasma generation area of the hollow structural body, the first electrode is in contact with an inner wall of the hollow structural body within the plasma generation area of the hollow structural body so as to ignite capacitively coupled plasma stably over a long period in a state of atmospheric pressure.

2. The plasma apparatus according to claim 1, wherein the non-linear structure of the first electrode is a corrugated structure.

3. The plasma apparatus according to claim 2, wherein the first electrode, which is the corrugated structure, is a coarseness and fineness.

4. The plasma apparatus according to claim 2, wherein the first electrode, which is the corrugated structure, has at least three flexed portions and at least one flexed portion is configured to contact the inner wall at the plasma generation area of the hollow structural body.

5. The plasma apparatus according to claim 4, wherein the first electrode, which is the corrugated structure, has a structure avoiding an inhibited space with a predetermined diameter centering on the axis of the hollow structural body within the plasma generation area of the hollow structural body.

6. The plasma apparatus according to claim 1, wherein the deformation structure of the first electrode is a rectangular deformation structure.

7. The plasma apparatus according to claim 6, wherein the first electrode, which is the rectangular deformation structure, is a coarseness and fineness.

8. The plasma apparatus according to claim 1, wherein the deformation structure of the first electrode is a coil-like structure.

9. The plasma apparatus according to claim 8, wherein the first electrode, which is the coil-like structure, is a coarseness and fineness.

10. The plasma apparatus according to claim 8, wherein the first electrode, which is the corrugated structure, has at least three flexed portions and at least one flexed portion is configured to contact the inner wall at the plasma generation area of the hollow structural body.

11. The plasma apparatus according to claim 1, wherein the first electrode is made of platinum.

12. A plasma apparatus comprising:
a hollow structural body comprising a cylindrical-shaped ceramics, the hollow structural body comprising a plasma generation area inside the hollow structural body;

a first electrode comprising a conductive wire member disposed in one plane, the first electrode being disposed inside the hollow structural body; and a second electrode formed as a hollow conductive cylindrical member, the conductive cylindrical member having a first end and a second end, the first end and the second end defining therebetween limits of the plasma generation area inside the hollow structural body;

wherein the first electrode has a non-linear structure that has a portion disposed in an area of an outer circumferential side from a predetermined diameter centering on an axis of the hollow structural body within at least the plasma generation area of the hollow structural body, the first electrode is in contact with at least one point of an inner wall of the hollow structural body within the plasma generation area of the hollow structural body, and the first electrode is made of platinum.

13. The plasma apparatus according to claim 12, wherein the non-linear structure of the first electrode is a corrugated structure.

14. The plasma apparatus according to claim 12, wherein the one point of the first electrode is provided at the shortest distance between the first electrode and the second electrode.

* * * * *